United States Patent [19]
Bate

[11] 3,979,604
[45] Sept. 7, 1976

[54] INFRARED CHARGE-COUPLED IMAGER

[75] Inventor: Robert T. Bate, Richardson, Tex.

[73] Assignee: Texas Instruments Incorporated, Dallas, Tex.

[22] Filed: Feb. 24, 1975

[21] Appl. No.: 552,520

Related U.S. Application Data

[63] Continuation of Ser. No. 388,845, Aug. 16, 1973, abandoned.

[52] U.S. Cl. .......................... 307/221 D; 250/211 J; 250/370; 307/311; 357/24; 357/30
[51] Int. Cl.² .......................................... H01L 31/10
[58] Field of Search ............. 357/24, 30; 250/211 J, 250/578, 370; 307/304, 221 D

[56] References Cited
UNITED STATES PATENTS

| | | | |
|---|---|---|---|
| 3,586,857 | 6/1971 | Glasow et al. ...................... | 357/30 |
| 3,771,149 | 11/1973 | Collins et al. ......................... | 357/24 |
| 3,869,572 | 3/1975 | Carter ................................... | 357/24 |

OTHER PUBLICATIONS

Hibberd, *Integrated Circuits*, McGraw-Hill, N.Y., 1969, p. 3, 23–26, 39–41, and 133.

*Primary Examiner*—William D. Larkins
*Attorney, Agent, or Firm*—Harold Levine; James T. Comfort; Richard L. Donaldson

[57] ABSTRACT

A charge coupled device for infrared imaging covered with a layer of insulation for absorbing infrared patterns and generating signals due to the temperature dependence of dark current in the charge coupled device.

10 Claims, 6 Drawing Figures

INFRARED CHARGE-COUPLED IMAGER

This is a continuation of application Ser. No. 388,845, filed Aug. 16, 1973, now abandoned.

BACKGROUND OF THE INVENTION

1. Field of the Invention

This invention relates to semiconductor imaging devices and more particularly to imaging devices and systems suitable for infrared qualitative detection.

2. Decription of the Prior Art

A typical prior art infrared imaging system has includes the following components: scanning optics including mirrors for moving incident lines of infrared radiation from the target or object; an array of infrared detectors suitably maintained in a cooled condition; a plurality of voltage amplifiers connected to each detector in the array; the electro-optic multiplexer including a suitable array of light emitting diodes, the scanning optics being synchronized with the target optics; a vidicon for receiving the outputs from the electro-optic multiplexer and suitable for driving a conventional CRT display.

Charge transfer devices, including charge-coupled devices and bucket-brigade devices, have been successfully employed in solid state visual imaging systems. An example is described by Weimer, Kovac, Shallcross and Pike in "Self-Scanned Image Sensors Based on Charge Transfer by the Bucket-Brigade Method," I.E.E.E. Transactions on Electron Devices, November 1971, which is incorporated herein by reference. Such systems eliminate much of the scanning, amplifying and multiplexing components of the conventional imaging systems. However, it has not been heretofore possible to make wide spread application of such simplified visual imaging systems to IR imaging because of certain problems unique to IR imaging. The primary problems have been one of fabrication of IR sensitive devices and the suppression of interfering background without using unduly complex electronics.

It is therefore a feature of this invention to provide an improved means of fabricating charge transfer devices to increase their sensitivity to infrared radiation.

It is another feature of this invention to provide an improved charge transfer device sensitive to infrared radiation applicable in a conventional charge-coupled or bucket-brigade visual imaging system without additional complex electronics.

It is yet another feature of this invention to provide an improved charge transfer device suitable for infrared radiation detection by modifying only slightly charge transfer devices that have been proven with respect to visual imaging application.

SUMMARY OF THE INVENTION

The invention includes in one aspect the fabrication of an infrared sensitive charge-coupled device by adding onto a charge-coupled device suitable for visual imaging a thin layer of insulation over the electrode surface. The layer is preferably of plastic or of epoxy or other material suitable for absorbing infrared energies in the infrared spectrum beyond 3 micrometers.

Another aspect of the invention includes the incorporation of the device just described in an overall system where the detected infrared energy is converted to proportional electrical signals for meaningful readout or display purposes.

BRIEF DESCRIPTION OF THE DRAWINGS

So that the manner in which the above-recited features, advantages and objects of the invention, as well as others which will become apparent, are attained and understood in detail, more particular description of the invention briefly summarized above may be had by reference to the embodiments thereof which are illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

In the Drawings

DESCRIPTION OF PREFERRED EMBODIMENTS

Charge-coupled devices are metal-insulator-semiconductor devices which belong to a general class of semi-conductor charge devices which store and transfer information in the form of electrical charge. The charge-coupled devices are distinguished by the property that the semiconductor portion of the devices is, for the most part, homogeneously doped, regions of different conductivity being required only for injecting or extracting charge.

Figure 1:
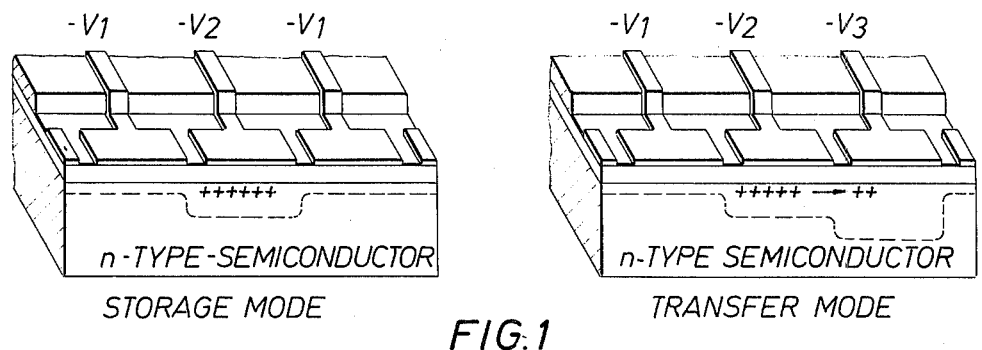
FIG. 1 is a cutaway view of a charge-coupled device operating in a manner suitable for image system application.

Structurally, a CCD consists typically of an n-type or p-type silicon substrate, an MOS-type silicon dioxide insulation layer, and a metallized electrode over that, as illustrated in FIG. 1. No p-n junctions are required to shift data from one point to another, whereas conventional MOS shift registers need a minimum of three transistors per data point and about six to eight diffusions per transistor. Diffused p-n junctions are required in a CCD only to input and output data and, in memory devices, also to regenerate a signal after it has made a number of shifts.

In operation, a CCD with, say an n-type silicon substrate first has a threshold voltage of about $-1$ to $-2$ volts $(-V_1)$ applied to the substrate so that a uniform depletion layer forms beneath all electrodes. Next, to enter the storage mode, a more negative voltage of around $-10$ V $(-V_2)$ is applied to an individual electrode—the middle one in the storage element of FIG. 1($a$) for example—creating a deeper depletion region beneath it that spatially defines the potential well. The device can now receive and store charges (minority carriers). In a memory device these would be injected into the substrate by an input p-n junction, and in a camera device they would take the form of hole-electron pairs created by light impinging on the silicon substrate. In either case, since the minority carriers in n-type silicon are holes, and since the electrode is negative with respect to the substrate, the holes are attracted toward the electrode and held in the potential well beneath it.

In the transfer mode, the stored charge is shifted along by the application of $-V_3$, a still more negative voltage of about $-20$ V, to the third electrode of the element, as shown in FIG. 1($b$). This establishes a well of even greater potential number that electrode, which attracts to it the holes stored under the middle electrode. The voltages are now returned to the condition of FIG. 1($a$), except that they have moved on by one electrode.

A typical semiconductor charge-coupled device (CCD) shift register is described, for example, in Boyle, et al, Bell System Technical Journal 49, 587 (1970). In the shift register, a DC bias sufficient to invert the semiconductor surface is applied between electrodes, and the semiconductor material, and clocking pulses are applied sequentially to the electrodes. Because of the invention, semiconductor surface minority carriers are drawn to the semiconductor-insulator interface and tend to collect in the potential wells under the electrodes. When the clocking pulses are sufficiently large, the minority carriers migrate from the area under one electrode to the area under the next following, a potential well being produced by the clocking pulses.

Because of the qualities just described, it has been discovered that the charge-coupled devices may advantageously be utilized as an optical imager. Bertam, "Application of the Charge Coupled Device Concept to Solid State Image Sensors" 1971 I.E.E.E. International Conventional, Mar. 22–25, New York, N.Y., describes such a charge coupled imager which includes an optical integration section and a separate storage section. The description there set forth is specifically herein incorporated by reference.

CCD's have also successfully been employed in the complete optical imaging system as set forth in Altman, "The New Concept for Memory and Imaging: Charge Coupling" *Electronics*, June 21, 1971, the description being specifically incorporated herein by reference.

Moreover, an improved two-level metallization technique is described for CCD's incorporated in an optical imager in U.S. Pat. No. 3,869,572, which is incorporated herein by reference. The operation description which follows assumes this improved structure, although basically the system operation is not materially different than for the CCD structure described in the Altman article, except to accommodate the two-level metallic CCD's.

Figure 2:
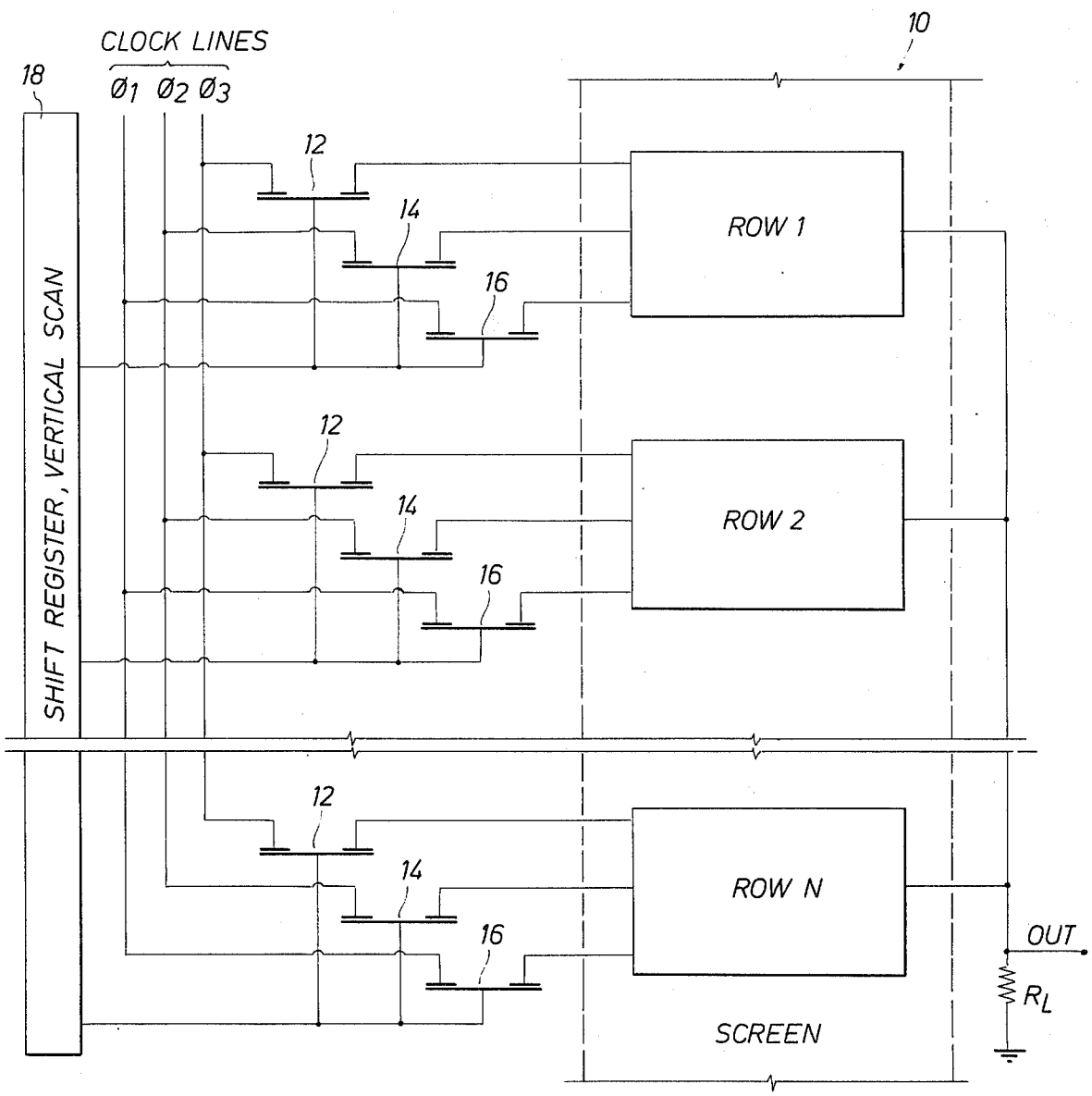
FIG. 2 is a schematic and block diagram illustration of an imager system operating in a fashion compatible with charge transfer devices.

With reference to FIG. 2, there is illustrated an optical imager system. The imager system includes an optically active region or screen 10. This screen is comprised of a plurality of optically active regions disposed in horizontal rows labeled row 1, row 2 . . . row N. Each row of the screen 10 comprises a multiphase charge coupled shift register. A two level metallization system is advantageously utilized to minimize surface area of semiconductor material required for the screen 10. Output means labeled $R_L$ are coupled to each row of the imager screen 10. As understood by those skilled in the art, the output of a charge coupled shift register may be detected through ohmic contact to a p-n junction region (not shown) formed in the surface region of the substrate.

A three-phase, charge-coupled shift register embodiment is illustrated in FIG. 2 and the multiphase clocks $\phi_1$, $\phi_2$ and $\phi_3$ are coupled to respective rows of the imager's screen 10 via insulated gate field effect transistor switching devices illustrated generally at 12, 14 and 16. Transistor 16 couples $\phi_1$ of the clocks to the charge coupled shift register while transistors 14 and 12 respectively couple clocks $\phi_2$ and $\phi_3$. The switching transistors 12, 14 and 16 are energized by vertical scan means shown in block diagram at 18. When it is desired to read information, for example, from row 1, the vertical scan means 18 provides a signal to the gates of transistor 12, 14 and 16, driving these transistors into conduction and enabling clock pulses $\phi_1$, $\phi_2$ and $\phi_3$ to be applied to the charge coupled shift register defining row 1 of the imager. The vertical scan means may comprise a bucket-brigade shift register configuration of insulated gate field effect transistors, as detailed more in U.S. Pat. No. 3,869,572.

Figure 3:
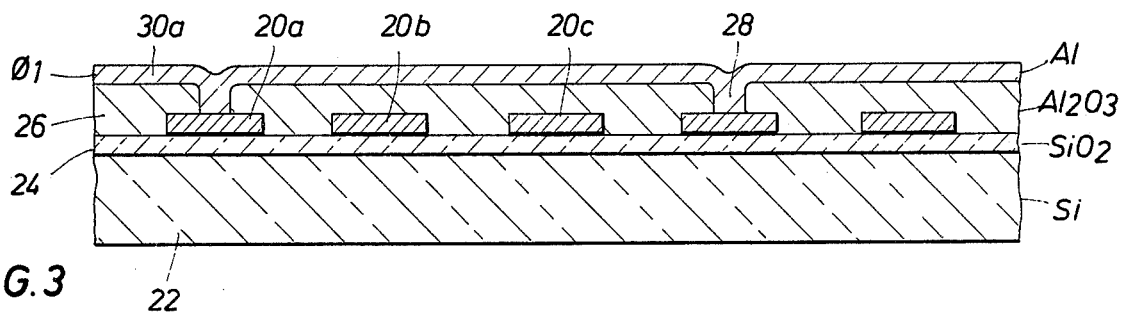
FIG. 3 is a cross-sectional view along line 3—3 of FIG. 4.
Figure 4:
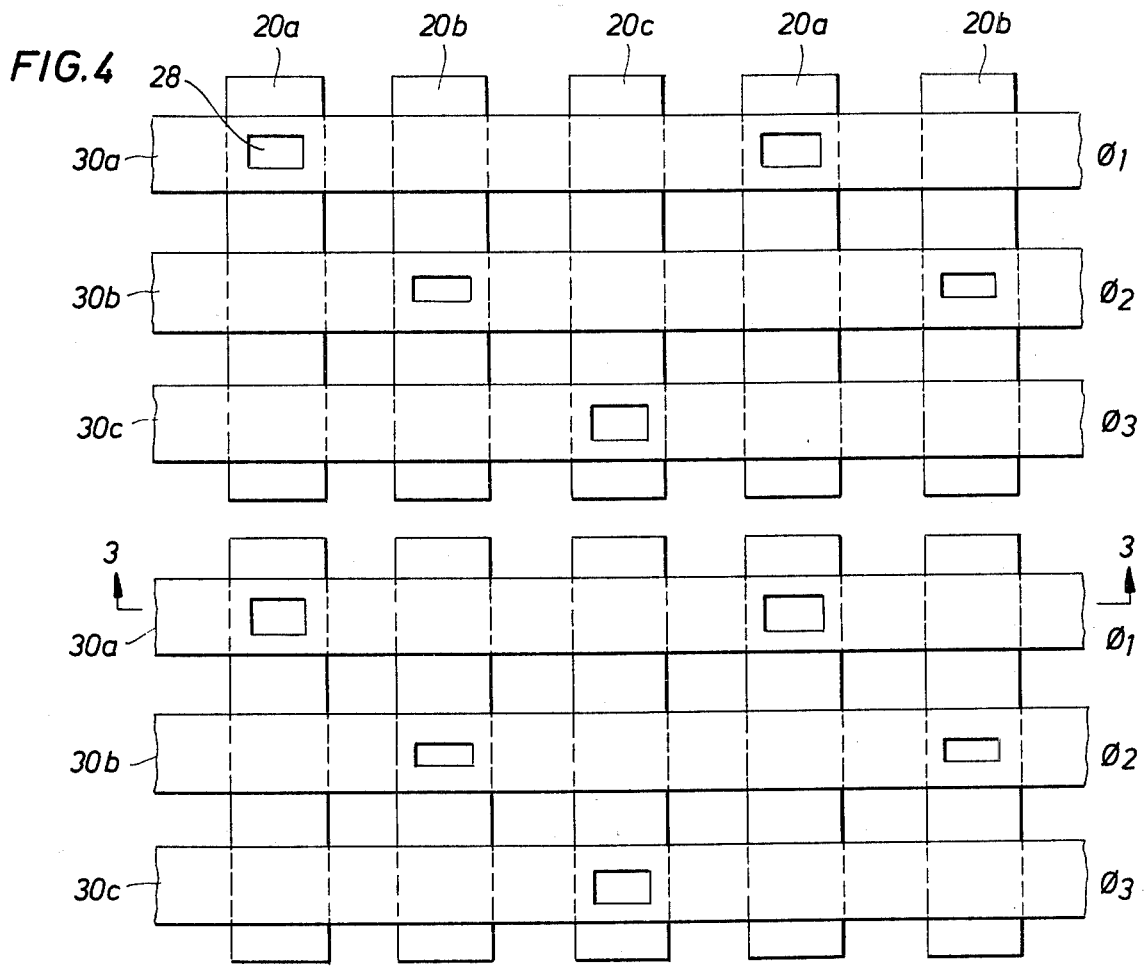
FIG. 4 is a plan view illustrating two rows of the imager illustrated in FIG. 2 showing a two-level metallization system.

Portions of two rows of the two-metallic imager screen 10 are illustrated in FIGS. 3 and 4. For the three-phase shift register embodiment illustrated, a set of three electrodes such as 20$a$, 20$b$ and 20$c$ defines one bit of the charge coupled shift register and correspondingly, one resolution element of the imager. The electrodes 20$a$, 20$b$ and 20$c$ are formed on a semiconductor substrate 22 and are separated therefrom by a relatively thin insulating layer 24. Preferably the substrate is n-type silicon, and the insulating layer 24 is silicon oxide formed to a thickness of about 1,000 A. Other insulating materials such as silicon nitride could also be used. Also other semiconductor materials may be utilized if desired. A first level metallization is formed over the insulating layer 24, and this level is patterned by conventional techniques such as photolithographic masking and etching to provide a plurality of elongated, spaced apart substantially parallel electrodes 20$a$, 20$b$ and 20$c$. These electrodes are then covered with a relatively thick insulating layer 26 which may, by way of example, comprise silicon oxide formed to a thickness on the order of 10,000 A. Also the layer 26 may advantageously be formed of anodized aluminum. Techniques for anodizing aluminum to form insulating layers are described in more detail in pending patent application Ser. No. 130,358, filed Apr. 1, 1971 (now U.S. Pat. No. 3,756,924 issued Sept. 4, 1973), by Dean R. Collins et al., entitled "Semiconductor Device and Method of Fabrication."

Apertures 28 are opened in the insulating layer 26 to expose selected ones of the electrodes 20$a$, 20$b$ and 20$c$. A second level of metallization is formed over the insulating layer 26 and extends through the apertures 28 into ohmic contact with the electrodes 20. Preferably this metallization comprises aluminum. This layer may be patterned to form substantially parallel conductive strips 30$a$, 30$b$ and 30$c$. These conductive strips lie in a direction substantially perpendicular to the length of the elongated electrodes 20$a$, 20$b$ and 20$c$, as may be seen most clearly in FIG. 4. The conductive strips 30$a$, 30$b$ and 30$c$ form the leads for the multiphase clocks $\phi_1$, $\phi_2$ and $\phi_3$ for the three phase embodiment illustrated. As may be seen, for example, with reference to the conductive strip 30$a$ to which the multiphase clock $\phi_1$ is applied, ohmic contact is made only to electrodes 20$a$ through the apertures 28. Similarly with respect to the conductive strip 30$b$, ohmic contact is made only to electrodes 20b; while with respect to conductive strip 30c, ohmic contact is made to electrodes 20c. This structure advantageously reduces the surface area required of the substrate 22.

Using drive lines 30a, 30b and 30c, dimensioned in accordance with design rules which require 0.4 mils for line width and 0.4 mils for spaces between metal lines, the minimum dimensions of one cell, i.e., resolution element, of the imager is 2.8 × 2.8 mils or 70 microns on a side, assuming that the horizontal spacing between charge coupled device electrodes such as 20a and 20b is approximately 0.1 mils. This enables a resolution on the order of 357 lines per inch.

The respective rows of the imager are read out horizontally in charge-coupled device shift register fashion via the application of appropriate drive voltages on the metal drive lines $\phi_1$, $\phi_2$ and $\phi_3$ which are ohmically connected through the apertures in the second level of insulation 26 to the charge-coupled device electrodes 20a, 20b and 20c. It may thus be seen that an imager is provided which does not require a storage section and which requires only two different sets of clocks; one set of clocks for the vertical scan generator 18 (FIG. 2), and another set of clocks for the horizontal charge-coupled device shift register.

Either the structure shown in FIG. 1 or the structure shown in FIG. 3 may be employed in an optical imager. Heretofore, however, the use of CCD's to perform a thermal imaging function commercially competitive with pyroelectric imagers has not been possible. This is true in spite of the fact that a silicon charge-coupled imager would offer distinct advantages in terms of compactness and manufacturability.

Two major problems would be encountered in attempting to use arrays of semiconductors charge transfer device (CTD), such as generally described above, for IR imagers. Although CCD's and bucket-brigade devices (BBD's) have proven successful in optical or visual imaging application, they have not been applicable to IR imaging. The first problem has been one of fabrication of a charge transfer device on IR-sensitive material. The second has been the compensation or suppression of background thermal radiation to prevent its masking or interfering with thermal targets or objects.

These two rather severe problems have been overcome by the invention in a rather simple manner so that the proven CCD visual imaging systems just described may be used as IR imagers without resorting to additional complex electronics.

Figure 5:
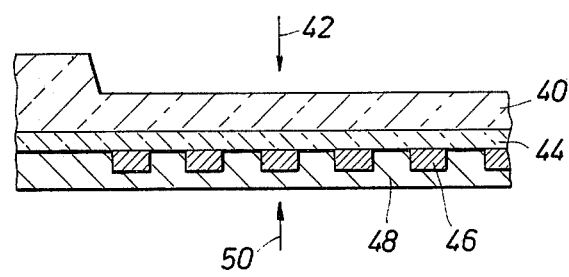
FIG. 5 is a cross-sectional view of a preferred embodiment of a single metallized charge-coupled device in accordance with the present invention.
Figure 6:
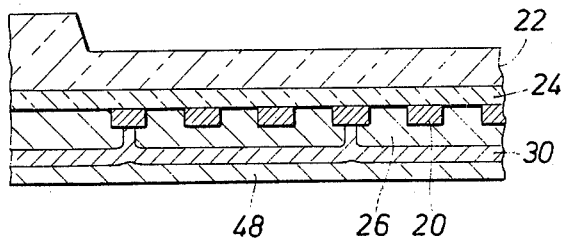
FIG. 6 is a cross-sectional view of a preferred embodiment of a two-level metallized charge-coupled device in accordance with the present invention.

Referring now to FIGS. 5 and 6, two embodiments of CCD's suitable for incorporating in an array for IR imaging are illustrated.

FIG. 5 is a cross-sectional view of a typical light sensitive CCD used for optical imaging that has been modified in accordance with the present invention for use in IR imaging. Silicon substrate 40 is thinned to less than 1 mil in the area of interest where it is to receive infrared radiation from direction 42 to prevent the dark current from washing out because of lateral thermal conductance. An insulation layer 44 of $SiO_2$ or similar substance of about 2,000 A separates silicon substrate 40 from metal electrodes 46, which may be many hundreds arrayed in rows, as previously described. Without more, the structure is suitable for a visual imaging application.

To make the above structure into an IR imaging structure, another insulating coating 48 is deposited over the electrodes 46 in the manner shown. This coating is electrically insulating, but capable of absorbing infrared radiation of wavelengths greater than about 3 microns. Epoxies and plastic materials are capable of such absorption.

In operation, it is contemplated that the IR will be focused on coating 48 from direction 50. Alternatively, IR could come from direction 42. The temperature of the coating will rise, the amount of temperature rise at a given bit (electrode) location will be proportional to the incident radiant energy at that point. The image will thus be reproduced as a spatial temperature variation over the CCD. This variation is sensed because the dark current at a given bit location is exponentially dependent on the local temperature. The hotter the bit location becomes, the more dark current it receives and builds up during a frame time. An 8°C temperature change results in doubling of the dark current. This exponential dependence on temperature tends to increase the contrast of the scene and thus provides some suppression of the infrared background. By clocking out the integrated charge build up into a storage register not exposed to thermal radiation (and hence not self-generating of a pattern of charges of its own), the results may be subsequently read out and/or displayed on a TV screen as with a conventional visual charge-coupled imager. Hence, the resulting display will be a qualitative representation of the thermal image.

Several steps may be taken to optimize the design of the device for this application. First, the thinning of the silicon substrate minimizes lateral thermal conduction. Second, the use of heavily doped or low lifetime silicon permits appreciable filling of a well by dark currents during one frame time, having the effect of increasing the signal-to-noise ratio. Operating at higher overall temperatures would tend to have the same effect, and could facilitate temperature control. Third, the thickness of the infrared absorbing layer can be optimized to provide complete absorption of the radiation while minimizing lateral thermal conduction. The foregoing optimization does not degrade the response to visible light, and the device should still be usable as an optical imager, as well.

Reference is now made to FIG. 6, which is essentially identical to the FIG. 3 CCD, except that an insulation layer 48, identical to that described above with respect to FIG. 5, is used to cover metal layer 30. This modified structure permits operation of the CCD as an IR imager in the manner described in the system illustrated in FIGS. 2 and 4.

It is possible to operate the imager just described in a differential mode, in which the difference between the target or object and a uniform background is sensed, such as set forth in patent application Ser. No. 365,294, filed May 29, 1973 (now U.S. Pat. No. 3,808,435 issued Apr. 30, 1974), by Bate et al, entitled "Infrared Quantum Differential Detector System." This operating mode has the effect of further suppressing the infrared background, and would also eliminate fixed pattern noise due to spatial variations of dark current.

While particular embodiments of the invention have been shown and discussed, it will be understood that the invention is not limited thereto, since many modifications may be made and will become apparent to those skilled in the art.

What is claimed is:

1. An infrared detecting device comprising charge coupled device shift register means having a radiation illumination surface, said shift register means including a semiconductor substrate;

an electrically insulating layer on one surface of said substrate;

a plurality of conductive spaced apart charge transfer electrodes disposed on said insulating layer to define optical resolution elements of said shift register means;

infrared energy absorption means adapted to absorb infrared energy having a wavelength sufficiently long that the semiconductor material of said substrate is substantially transparent to said radiation overlying said electrode means in cooperative relation with said illumination surface and comprising an insulative layer having a thickness sufficient for absorbing said pattern of infrared energy to generate a corresponding spatial thermal pattern in said layer thereby causing a corresponding pattern of electrical charge integration at said optical resolution elements of said shift register means; and means for exposing said illumination surface to a spatially varying pattern of infrared radiation for transmission to the infrared absorption means substantially in the absence of radiation having a wavelength which is absorbed by the semiconductor material of said substrate.

2. An infrared detecting device according to claim 1, wherein said illumination surface is located at a surface of said semiconductor substrate opposite said one surface by a locally thinned region of said semiconductor substrate disposed in registration with said electrode means.

3. An infrared detecting device according to claim 1, wherein said infrared energy absorption means comprises a plastic material.

4. An infrared detecting device according to claim 1, wherein said infrared absorption means comprises an epoxy material.

5. A compact infrared imager comprising:

a semiconductor substrate having a first relatively thin insulating layer over one surface thereof, a surface of said substrate opposite said one surface providing an infrared energy receiving surface for said imager;

a first level of metallization defining a plurality of substantially parallel spaced apart electrodes over said first insulating layer;

a second relatively thick insulating layer over said first level metallization defining a plurality of apertures selectively exposing said electrodes;

a second level of metallization defining a plurality of substantially parallel conductive strips overlying said second insulating layer and extending through said apertures to selectively ohmically contact said electrodes;

a third relatively thin insulating layer comprising infrared energy absorption means overlying said first and second levels of metallization;

means for exposing said energy receiving surface to a spatially varying pattern of infrared radiation for transmission to the infrared absorption means substantially in the absence of radiation having a wavelength which is absorbed by the semiconductor material of said substrate; said infrared radiation having a wavelength sufficiently long that the semiconductor material of said substrate is substantially transparent to said radiation;

said third insulating layer providing substantially complete absorption of said pattern of infrared energy to generate a corresponding spatial thermal pattern in said third insulating layer; and means for selectively applying multiphase clocks to said plurality of conductive strips.

6. A compact infrared imager according to claim 5, wherein said infrared energy receiving surface is located at a locally thinned region of said semiconductor substrate in cooperative registration with said first level of metallization.

7. A compact infrared imager comprising charge coupled device shift register means including a silicon substrate and having an infrared illumination surface, a first relatively thin insulating layer of silicon oxide formed on one surface of said silicon substrate, a first level of aluminum defining a plurality of substantially parallel spaced apart charge transfer electrodes over said first silicon oxide layer and forming optical resolution elements of said shift register means, a second relatively thick insulating layer over said aluminum defining a plurality of apertures selectively exposing said electrodes, a second level of aluminum defining a plurality of substantially parallel conductive strips over said second insulating layer and extending through said apertures to selectively ohmically contact said electrodes, a third relatively thin insulating layer of infrared energy absorption means comprising plastic material overlying said second level of aluminum, means for exposing said illumination surface to a spatially varying pattern of infrared radiation for transmission to the infrared absorption means substantially in the absence of radiation having a wavelength which is absorbed by the semiconductor material of said substrate, said infrared radiation having a wavelength sufficiently long that the semiconductor material of said substrate is substantially transparent to said radiation;

said absorption means having a thickness adapted to provide substantially complete absorption of said infrared energy pattern to cause generation of a corresponding spatial thermal pattern therein, said spatial thermal pattern causing a corresponding pattern of electrical charge integration at said optical resolution elements, and means for selectively applying multiphase clocks to said plurality of conductive strips.

8. An infrared imager system comprising a semiconductor substrate, an infrared energy illumination surface for said imager adjacent a surface of said semiconductor substrate, a plurality of rows of thermally active, substantially parallel charge coupled shift register means defined in a first region of said substrate, said shift registers respectively comprising a first level of metallization over a first relatively thin insulating layer, providing a plurality of substantially parallel spaced apart electrodes defining optical resolution elements of said shift register means, a second relatively thick insulating layer over said first level metallization defining a plurality of apertures selectively exposing said electrodes, a second level of metallization defining a plurality of substantially parallel conductive strips overlying said second insulating layer and extending through said apertures to selectively ohmically contact said electrodes and a third relatively thin insulating layer comprising infrared energy absorption means overlying said second level of metallization, means for exposing said energy receiving surface to a spatially varying pattern of infrared radiation having a wavelength sufficiently long that the semiconductor material of said substrate is substantially transparent to said radiation for transmission to the infrared absorption means substantially in the absence of radiation having a wavelength which is absorbed by the semiconductor material of said substrate, said third insulating layer adapted to absorb said infrared energy pattern incident on said illumination surface for generating in said third insulating layer a corresponding spatial thermal pattern resulting in a corresponding pattern of charge integration at said optical resolution elements, a multiphase clock source, switching means for coupling said plurality of conductive strips to said multiphase clock source, scan means operably connected to said switching means for selectively addressing respective rows of said thermally active charge coupled shift registers, and output means for detecting electrical charge resulting from the image detected by said optical resolution elements of said charge coupled shift register means.

9. An infrared imager system according to claim 8, wherein said infrared energy absorption means comprises plastic material capable of absorption of infrared energies having wavelengths greater than 3 microns.

10. A method of using a radiation detector device comprising charge coupled device shift register means including a semiconductor substrate, an electrically insulating layer on one surface of said substrate, a plurality of conductive spaced apart charge electrodes disposed on said means, and a further layer of insulating material overlying said electrodes; such method comprising the steps of:

exposing an illumination surface of said shift register means to a spatially varying pattern of infrared radiation for transmission to said further layer of insulating material, said infrared radiation having a wavelength sufficiently long that the semiconductor material of said substrate is substantially transparent to said radiation and said layer of insulating material comprising means for absorbing said infrared radiation, said further layer of insulating material comprising means for absorbing said infrared radiation to generate in said further insulating layer a spatially varying thermal pattern corresponding with said pattern of infrared radiation, said thermal pattern thereby causing a corresponding pattern of electrical charge integration at said optical resolution elements of said shift register means.

* * * * *